(12) United States Patent
Nathan et al.

(10) Patent No.: US 8,044,893 B2
(45) Date of Patent: Oct. 25, 2011

(54) VOLTAGE PROGRAMMED PIXEL CIRCUIT, DISPLAY SYSTEM AND DRIVING METHOD THEREOF

(75) Inventors: Arokia Nathan, Waterloo (CA); Gholamreza Reza Chaji, Waterloo (CA); Peyman Servati, Waterloo (CA)

(73) Assignee: Ignis Innovation Inc., Kitchener, Ontario (CA)

( * ) Notice: Subject to any disclaimer, the term of this patent is extended or adjusted under 35 U.S.C. 154(b) by 1238 days.

(21) Appl. No.: 11/341,332

(22) Filed: Jan. 27, 2006

(65) Prior Publication Data

US 2006/0187153 A1    Aug. 24, 2006

(30) Foreign Application Priority Data

Jan. 28, 2005   (CA) ..................................... 2495726

(51) Int. Cl.
    *G09G 3/30*    (2006.01)
(52) U.S. Cl. .......... 345/76; 345/82; 345/204; 315/169.3
(58) Field of Classification Search .............. 345/76–82, 345/90, 92, 93, 95, 99, 100, 204, 206, 214; 349/42–43, 151; 315/169.3; 313/463
    See application file for complete search history.

(56) References Cited

U.S. PATENT DOCUMENTS

| | | |
|---|---|---|
| 4,996,523 A | 2/1991 | Bell et al. |
| 5,266,515 A | 11/1993 | Robb et al. |
| 5,498,880 A | 3/1996 | Lee et al. |
| 5,619,033 A | 4/1997 | Weisfield |
| 5,648,276 A | 7/1997 | Hara et al. |
| 5,714,968 A | 2/1998 | Ikeda |
| 5,748,160 A | 5/1998 | Shieh et al. |
| 5,874,803 A | 2/1999 | Garbuzov et al. |
| 5,880,582 A | 3/1999 | Sawada |
| 5,903,248 A | 5/1999 | Irwin |
| 5,917,280 A | 6/1999 | Burrows et al. |
| 5,952,789 A | 9/1999 | Stewart et al. |
| 5,990,629 A | 11/1999 | Yamada et al. |
| 6,023,259 A | 2/2000 | Howard et al. |
| 6,069,365 A | 5/2000 | Chow et al. |
| 6,091,203 A | 7/2000 | Kawashima et al. |
| 6,097,360 A | 8/2000 | Holloman |
| 6,144,222 A | 11/2000 | Ho |
| 6,229,508 B1 | 5/2001 | Kane |
| 6,246,180 B1 | 6/2001 | Nishigaki |
| 6,252,248 B1 | 6/2001 | Sano et al. |

(Continued)

FOREIGN PATENT DOCUMENTS

CA        2249592        7/1998

(Continued)

OTHER PUBLICATIONS

Alexander et al.: "Pixel circuits and drive schemes for glass and elastic AMOLED displays"; dated Jul. 2005 (9 pages).
Chaji et al.: "A low-power driving scheme for a-Si:H active-matrix organic light-emitting diode displays"; dated Jun. 2005 (4 pages).
Chaji et al.: "A low-power high-performance digital circuit for deep submicron technologies"; dated Jun. 2005 (4 pages).

(Continued)

*Primary Examiner* — Lun-Yi Lao
*Assistant Examiner* — Shaheda Abdin
(74) *Attorney, Agent, or Firm* — Nixon Peabody LLP

(57) ABSTRACT

A voltage programmed pixel circuit, display system having the pixel circuit and driving method thereof is provided. The pixel circuit includes a light emitting device, a driving transistor connected to the light emitting device and a programming circuit. The programming circuit adjusts a pixel current during a programming cycle of the pixel circuit.

30 Claims, 13 Drawing Sheets

U.S. PATENT DOCUMENTS

| | | | |
|---|---|---|---|
| 6,288,696 B1 | 9/2001 | Holloman | |
| 6,307,322 B1 | 10/2001 | Dawson et al. | |
| 6,323,631 B1 | 11/2001 | Juang | |
| 6,392,617 B1 | 5/2002 | Gleason | |
| 6,433,488 B1 | 8/2002 | Bu | |
| 6,501,466 B1 | 12/2002 | Yamagashi et al. | |
| 6,580,408 B1 | 6/2003 | Bae et al. | |
| 6,693,610 B2 | 2/2004 | Shannon et al. | |
| 6,697,057 B2 * | 2/2004 | Koyama et al. | 345/204 |
| 6,734,636 B2 | 5/2004 | Sanford et al. | |
| 6,859,193 B1 | 2/2005 | Yumoto | |
| 6,919,871 B2 | 7/2005 | Kwon | |
| 6,940,214 B1 | 9/2005 | Komiya et al. | |
| 7,129,914 B2 | 10/2006 | Knapp et al. | |
| 7,248,236 B2 | 7/2007 | Nathan et al. | |
| 7,274,345 B2 * | 9/2007 | Imamura et al. | 345/76 |
| 7,310,092 B2 * | 12/2007 | Imamura | 345/204 |
| 2001/0002703 A1 | 6/2001 | Koyama | |
| 2001/0026257 A1 | 10/2001 | Kimura | |
| 2001/0030323 A1 | 10/2001 | Ikeda | |
| 2001/0043173 A1 | 11/2001 | Troutman | |
| 2001/0045929 A1 | 11/2001 | Prache | |
| 2002/0000576 A1 | 1/2002 | Inukai | |
| 2002/0011796 A1 | 1/2002 | Koyama | |
| 2002/0011799 A1 | 1/2002 | Kimura | |
| 2002/0048829 A1 | 4/2002 | Yamazaki et al. | |
| 2002/0195968 A1 | 12/2002 | Sanford et al. | |
| 2003/0062524 A1 | 4/2003 | Kimura | |
| 2003/0090481 A1 * | 5/2003 | Kimura | 345/211 |
| 2003/0107560 A1 | 6/2003 | Yumoto et al. | |
| 2003/0111966 A1 | 6/2003 | Mikami et al. | |
| 2003/0230980 A1 * | 12/2003 | Forrest et al. | 313/600 |
| 2004/0070557 A1 | 4/2004 | Asano et al. | |
| 2004/0145547 A1 | 7/2004 | Oh | |
| 2004/0150595 A1 | 8/2004 | Kasai | |
| 2004/0155841 A1 | 8/2004 | Kasai | |
| 2004/0196275 A1 | 10/2004 | Hattori | |
| 2004/0252089 A1 | 12/2004 | Ono et al. | |
| 2005/0007357 A1 | 1/2005 | Yamashita et al. | |
| 2005/0067971 A1 | 3/2005 | Kane | |
| 2005/0285825 A1 | 12/2005 | Eom et al. | |
| 2006/0066527 A1 * | 3/2006 | Chou | 345/76 |
| 2006/0261841 A1 | 11/2006 | Fish | |

FOREIGN PATENT DOCUMENTS

| | | |
|---|---|---|
| CA | 2368386 | 9/1999 |
| CA | 2242720 | 1/2000 |
| CA | 2354018 | 6/2000 |
| CA | 2436451 | 8/2002 |
| CA | 2463653 | 1/2004 |
| EP | 1 028 471 A | 8/2000 |
| EP | 1 130 565 A1 | 9/2001 |
| EP | 1 465 143 A | 10/2004 |
| JP | 09 090405 | 4/1997 |
| JP | 11 231805 | 8/1999 |
| WO | 02/067327 A | 8/2002 |
| WO | 2006/053424 | 5/2006 |

OTHER PUBLICATIONS

Chaji et al.: "A novel a-Si:H AMOLED pixel circuit based on short-term stress stability of a-Si:H TFTs"; dated Oct. 2005 (3 pages).

Chaji et al.: "A novel driving scheme for high-resolution large-area a-Si:H AMOLED displays"; dated Aug. 2005 (4 pages).

Chaji et al.: "Driving scheme for stable operation of 2-TFT a-Si AMOLED pixel"; dated Apr. 2005 (2 pages).

Chaji et al.: "Dynamic-effect compensating technique for stable a-Si:H AMOLED displays"; dated Aug. 2005 (4 pages).

Chaji et al.: "eUTDSP: a design study of a new VLIW-based DSP architecture"; dated My 2003 (4 pages).

Chaji et al.: "High Speed Low Power Adder Design With A New Logic Style: Pseudo Dynamic Logic (SDL)"; dated Oct. 2001 (4 pages).

Chaji et al.: "Pseudo dynamic logic (SDL): a high-speed and low-power dynamic logic family"; dated 2002 (4 pages).

European Search Report for European Application No. EP 06 70 5080 dated Oct. 22, 2009 (5 pages).

International Search Report for International Application No. PCT/CA2006/000096 dated May 12, 2006 (2 pages).

Jafarabadiashtiani et al.: "A New Driving Method for a-Si AMOLED Displays Based on Voltage Feedback"; dated 2005 (4 pages).

Lee et al.: "Ambipolar Thin-Film Transistors Fabricated by PECVD Nanocrystalline Silicon"; dated 2006 (6 pages).

Ma e y et al: "Organic Light-Emitting Diode/Thin Film Transistor Integration for foldable Displays" Conference record of the 1997 International display research conference and international workshops on LCD technology and emissive technology. Toronto, Sep. 15-19, 1997 (6 pages).

Matsueda y et al.: "35.1: 2.5-in. AMOLED with Integrated 6-bit Gamma Compensated Digital Data Driver"; dated May 2004.

Nathan et al.: "Backplane Requirements for Active Matrix Organic Light Emitting Diode Displays"; dated 2006 (16 pages).

Nathan et al.: "Driving schemes for a-Si and LTPS AMOLED displays"; dated Dec. 2005 (11 pages).

Nathan et al.: "Invited Paper: a-Si for AMOLED—Meeting the Performance and Cost Demands of Display Applications (Cell Phone to HDTV)"; dated 2006 (4 pages).

Nathan et al.: "Thin film imaging technology on glass and plastic"; dated Oct. 31-Nov. 2, 2000 (4 pages).

Philipp: "Charge transfer sensing" Sensor Review, vol. 19, No. 2, Dec. 31, 1999, 10 pages.

Rafati et al.: "Comparison of a 17 b multiplier in Dual-rail domino and in Dual-rail D L (D L) logic styles"; dated 2002 (4 pages).

Safavian et al.: "Self-compensated a-Si:H detector with current-mode readout circuit for digital X-ray fluoroscopy"; dated Aug. 2005 (4 pages).

Safavian et al.: "TFT active image sensor with current-mode readout circuit for digital x-ray fluoroscopy [5969D-82]"; dated Sep. 2005 (9 pages).

Stewart M. et al., "Polysilicon TFT technology for active matrix OLED displays" IEEE transactions on electron devices, vol. 48, No. 5 (7 pages).

* cited by examiner

US 8,044,893 B2

VOLTAGE PROGRAMMED PIXEL CIRCUIT, DISPLAY SYSTEM AND DRIVING METHOD THEREOF

FIELD OF INVENTION

The present invention relates to a light emitting device display, and more specifically to a driving technique for the light emitting device display.

BACKGROUND OF THE INVENTION

Recently active-matrix organic light-emitting diode (AMOLED) displays with amorphous silicon (a-Si), poly-silicon, organic, or other driving backplane have become more attractive due to advantages over active matrix liquid crystal displays. An AMOLED display using a-Si backplanes, for example, has the advantages that include low temperature fabrication that broadens the use of different substrates and makes flexible displays feasible, and its low cost fabrication that yields high resolution displays with a wide viewing angle.

The AMOLED display includes an array of rows and columns of pixels, each having an organic light-emitting diode (OLED) and backplane electronics arranged in the array of rows and columns. Since the OLED is a current driven device, the pixel circuit of the AMOLED should be capable of providing an accurate and constant drive current.

FIG. 1 shows a pixel circuit as disclosed in U.S. Pat. No. 5,748,160. The pixel circuit of FIG. 1 includes an OLED 10, a driving thin film transistor (TFT) 11, a switch TFT 13, and a storage capacitor 14. The drain terminal of the driving TFT 11 is connected to the OLED 10. The gate terminal of the driving TFT 11 is connected to a column line 12 through the switch TFT 13. The storage capacitor 14, which is connected between the gate terminal of the driving TFT 11 and the ground, is used to maintain the voltage at the gate terminal of the driving TFT 11 when the pixel circuit is disconnected from the column line 12. The current through the OLED 10 strongly depends on the characteristic parameters of the driving TFT 11. Since the characteristic parameters of the driving TFT 11, in particular the threshold voltage under bias stress, vary by time, and such changes may differ from pixel to pixel, the induced image distortion may be unacceptably high.

U.S. Pat. No. 6,229,508 discloses a voltage-programmed pixel circuit which provides, to an OLED, a current independent of the threshold voltage of a driving TFT. In this pixel, the gate-source voltage of the driving TFT is composed of a programming voltage and the threshold voltage of the driving TFT. A drawback of U.S. Pat. No. 6,229,508 is that the pixel circuit requires extra transistors, and is complex, which results in a reduced yield, reduced pixel aperture, and reduced lifetime for the display.

Another method to make a pixel circuit less sensitive to a shift in the threshold voltage of the driving transistor is to use current programmed pixel circuits, such as pixel circuits disclosed in U.S. Pat. No. 6,734,636. In the conventional current programmed pixel circuits, the gate-source voltage of the driving TFT is self-adjusted based on the current that flows through it in the next frame, so that the OLED current is less dependent on the current-voltage characteristics of the driving TFT. A drawback of the current-programmed pixel circuit is that an overhead associated with low programming current levels arises from the column line charging time due to the large line capacitance.

SUMMARY OF THE INVENTION

It is an object of the invention to provide a method and system that obviates or mitigates at least one of the disadvantages of existing systems.

In accordance with an aspect of the present invention, there is provided a pixel circuit including: a light emitting device having a first electrode and a second electrode; a driving transistor having a gate terminal, a first terminal and a second terminal, the first terminal of the driving transistor being connected to the first electrode of the light emitting device; a first capacitor having first and second terminals, the first terminal of the first capacitor being connected to the gate terminal of the driving transistor, the second terminal of the first capacitor being connected to the first terminal of the driving transistor and the first electrode of the light emitting device; a first switch transistor having a gate terminal, a first terminal and a second terminal, the first terminal of the first switch transistor being connected the gate terminal of the driving transistor and the first terminal of the first capacitor; and a programming circuit for locally adjusting a pixel current during the programming cycle of the pixel circuit, the programming circuit having a programming transistor, the programming transistor being connected to the first electrode of the light emitting device and being biased during the programming cycle of the pixel circuit.

In accordance with a further aspect of the present invention, there is provided a display system, including: a display array including a plurality of pixel circuits, a driver system for driving the display array to establish a programming cycle and a driving cycle; and a controller for controlling the driver system, each pixel circuit including a light emitting device having a first electrode and a second electrode; a driving transistor having a gate terminal, a first terminal and a second terminal, the first terminal of the driving transistor being connected to the first electrode of the light emitting device; a first capacitor having first and second terminals, the first terminal of the first capacitor being connected to the gate terminal of the driving transistor, the second terminal of the first capacitor being connected to the first terminal of the driving transistor and the first electrode of the light emitting device; a first switch transistor having a gate terminal, a first terminal and a second terminal, the first terminal of the first switch transistor being connected the gate terminal of the driving transistor and the first terminal of the first capacitor; and a programming circuit for locally adjusting a pixel current during the programming cycle, the programming circuit having a programming transistor, the programming transistor being connected to the first electrode of the light emitting device and being biased during the programming cycle.

In accordance with a further aspect of the present invention, there is provided a method of driving a pixel circuit, the pixel circuit comprising a light emitting device having a first electrode and a second electrode; a driving transistor having a gate terminal, a first terminal and a second terminal, the first terminal of the driving transistor being connected to the first electrode of the light emitting device; a first capacitor having first and second terminals, the first terminal of the first capacitor being connected to the gate terminal of the driving transistor, the second terminal of the first capacitor being connected to the first terminal of the driving transistor and the first electrode of the light emitting device; a first switch transistor having a gate terminal, a first terminal and a second terminal, the first terminal of the first switch transistor being connected the gate terminal of the driving transistor and the first terminal of the first capacitor; and a programming circuit having a programming transistor, the programming transistor being connected to the first electrode of the light emitting device; the method including the steps: at a programming cycle of the pixel circuit, biasing the programming transistor to locally adjust a pixel current; at a driving cycle of the pixel circuit, enabling the programming transistor to be off.

In accordance with a further aspect of the present invention, there is provided a pixel circuit incorporating a short term biasing condition in which a programming TFT is stable.

In accordance with a further aspect of the present invention, there is provided a pixel circuit structure including two distinct parts having one programming part and one driving part, in which the programming part is under stress for a small fraction of frame time and adjusting the pixel current, while the driving part drives an OLED.

This summary of the invention does not necessarily describe all features of the invention. Other aspects and features of the present invention will be readily apparent to those skilled in the art from a review of the following detailed description of preferred embodiments in conjunction with the accompanying drawings.

BRIEF DESCRIPTION OF THE DRAWINGS

These and other features of the invention will become more apparent from the following description in which reference is made to the appended drawings wherein.

DETAILED DESCRIPTION

Embodiments of the present invention are described using a pixel having an organic light emitting diode (OLED) and a driving thin film transistor (TFT). OLED may be a NIP inverted or PIN non-inverted OLED. However, the pixel may include any light emitting device other than OLED, and the pixel may include any driving transistor other than TFT. It is noted that in the description, "pixel circuit" and "pixel" may be used interchangeably.

The embodiments of the present invention provide locally referenced voltage programmed pixel circuits in which a stable biasing condition is used for a part of the pixel circuit (programming part), and a programming circuit is used to adjust the pixel current during the programming cycle of the pixel circuit locally.

The embodiments of the present invention provide a technique for driving a voltage programmed pixel to provide a stable current source to the OLED. The embodiments of the present invention provide a technique for driving a column/row of voltage programmed pixels to provide stable light emitting device display operation.

Figure 1:
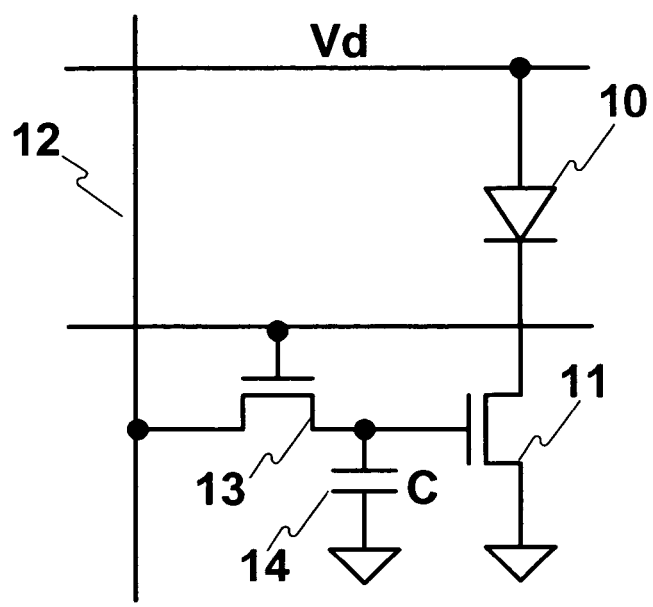
FIG. 1 is a diagram showing a conventional 2-TFT voltage programmed pixel circuit.
Figure 2:
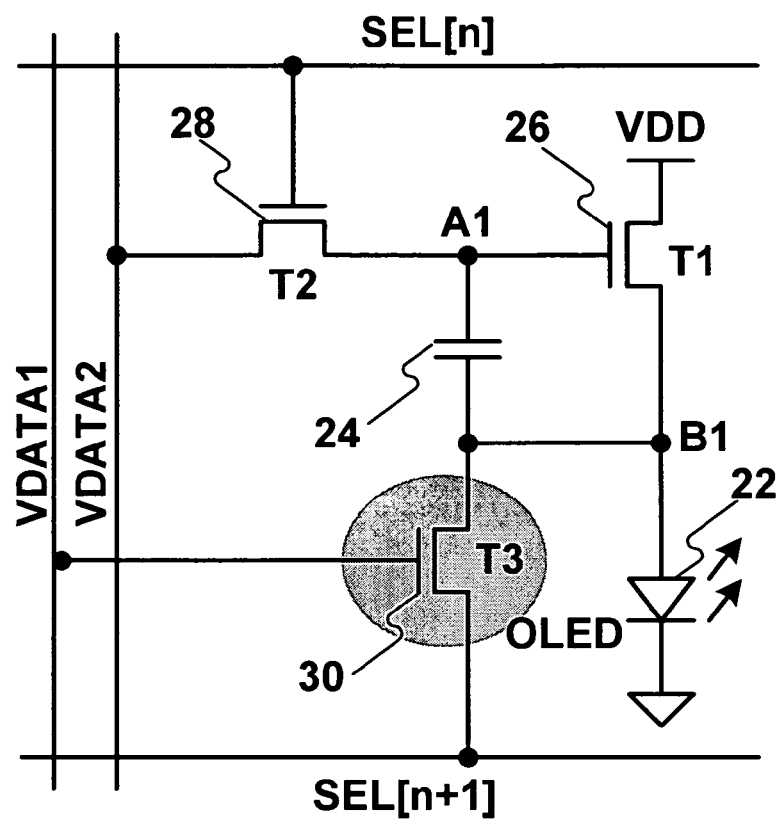
FIG. 2 is a diagram showing a pixel circuit in accordance with an embodiment of the present invention.

FIG. 2 illustrates a locally referenced voltage programmed pixel circuit 20 in accordance with an embodiment of the present invention. The pixel circuit 20 includes an OLED 22, a storage capacitor 24, a driving transistor 26, a switch transistor 28, and a programming circuit having a programming transistor 30. A select line SEL[n] is connected to the switch transistor 28. A signal line VDATA1 is connected to the programming transistor 30. A signal line VDATA2 is connected to the switch transistor 28. A negative voltage line SEL[n+1] is connected to the programming transistor 30. A positive voltage line VDD is connected to the driving transistor 26.

The transistors 26, 28 and 30 are n-type TFTs. However, the transistors 26, 28 and 30 may be p-type transistors. The driving technique applied to the pixel circuit 20 is also applicable to a complementary pixel circuit having p-type transistors. The transistors 26, 28 and 30 may be fabricated using amorphous silicon, nano/micro crystalline silicon, poly silicon, organic semiconductors technologies (e.g. organic TFT), NMOS/PMOS technology or CMOS technology (e.g. MOSFET). A plurality of pixel circuits 20 may form an AMOLED display.

The gate terminal of the driving transistor 26 is connected to VDATA2 through the switch transistor 28. The drain terminal of the driving transistor 26 is connected to VDD. The source terminal of the driving transistor 26 is connected to the anode electrode of the OLED 22 (at node B1). The cathode electrode of the OLED 22 is connected to a common ground.

The gate terminal of the switch transistor 28 is connected to SEL[n]. The drain terminal of the switch transistor 28 is connected to VDATA2. The source terminal of the switch transistor 28 is connected to the gate terminal of the driving transistor 26 (at node A1).

The gate terminal of the programming transistor 30 is connected to VDATA1. The drain terminal of the programming transistor 30 is connected to the anode terminal of the OLED 22 (at node B1). The source terminal of the programming transistor 30 is connected to SEL[n+1].

One terminal of the storage capacitor 24 is connected to the gate terminal of the driving transistor 26 and the source terminal of the switch transistor 28 at node A1. The other terminal of the storage capacitor 24 is connected to the source terminal of the driving transistor 26, the drain terminal of the programming transistor 30 and the anode electrode of the OLED 22 at node B1.

The programming transistor 30 is a stable local reference transistor due to its biasing condition, and is used to adjust the pixel current during the programming cycle of the pixel circuit as a local current source. Thus, the pixel current becomes stable despite the aging effects of the driving transistor 26 and the OLED 22. It is noted that in the description, the terms "programming transistor" and "local reference transistor" may be used interchangeably.

Figure 3:
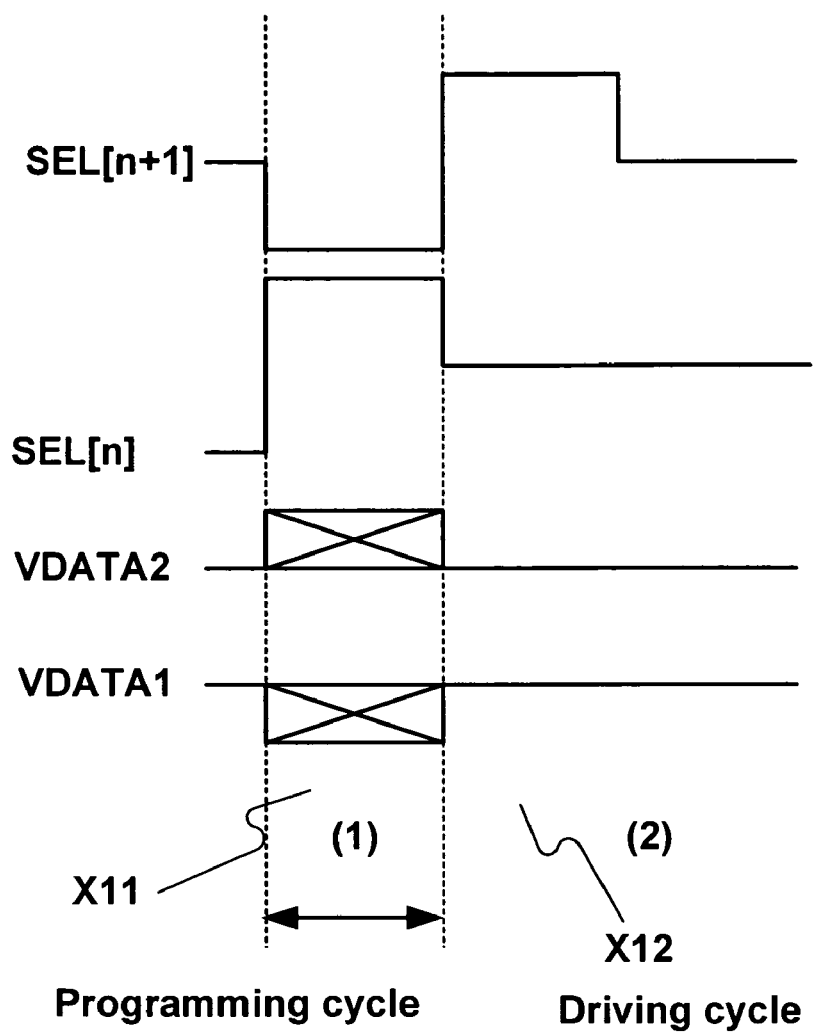
FIG. 3 is a timing diagram showing an example of waveforms for driving the pixel circuit of FIG. 2.

FIG. 3 illustrates a timing diagram showing an example of waveforms applied to the pixel circuit 20 of FIG. 2. Referring to FIGS. 2 and 3, the operation of the pixel circuit 20 includes a programming cycle X11 and a driving cycle X12.

SEL[n+1] is shared between nth and (n+1)th rows, and plays two different roles during the programming cycle of nth and (n+1)th row. During the programming cycle of nth row, SEL[n+1] is used to provide a signal VSS. During the programming cycle of the (n+1)th row, SEL[n+1] is used to provide the address signal of (n+1)th row. Therefore, at the second programming cycle X12 of nth row which is the first programming cycle X11 of (n+1)th row as well, SEL[n+1] goes to a high voltage to address (n+1)th row.

The first operating cycle X11: SEL[n] is high and SEL[n+1] has a negative voltage VSS. VDATA2 goes to a bias voltage $V_B$, and VDATA1 has the programming voltage $V_P$+VSS.

In X11, voltage at node A1 is $V_B$. Thus, voltage at node B1 can be written as $$VB1 = V_B - \left(\frac{(W/L)_{T3}}{(W/L)_{T1}}\right)^{1/2} V_P - \Delta V_T \quad (1)$$

$$-\Delta V_T = ((W/L)_{T3}/(W/L)_{T1})^{1/2} V_{T3} - V_{t1} \quad (2)$$

$$V_P = \text{VDATA1} - \text{VSEL}[n+1]. \quad (3)$$

where VB1 represents the voltage of node B1, $V_{T1}$ represent the threshold voltage of the driving transistor 26, $V_{T3}$ represent the threshold voltage of the programming transistor 30, $(W/L)_{T1}$ is the aspect ratio of the driving transistor 26, and $(W/L)_{T3}$ is the aspect ration of the programming transistor 30.

The second operating cycle X12: SEL[n] is low, and SEL[n+1] is high because of the next row programming cycle. During the driving cycle X12, the voltage of SEL[n+1] is changed. That is due to the programming cycle of a next row as described below, and it does not affect the programming of current row.

In X12, voltage at node B1 goes to $V_{OLED}$, and voltage at node A1 goes to $$VA1 = \left(\frac{(W/L)_{T3}}{(W/L)_{T1}}\right)^{1/2} V_P + \Delta V_T + V_{OLED} \quad (4)$$

wherein $V_{OLED}$ represents voltage at the OLED 22.

The gate-source voltage VGS of the driving transistor 26 is given by:

$$\text{VGS} = ((W/L)_{T3}/(W/L)_{T1})^{1/2} V_P + \Delta V_T \quad (5)$$

In this embodiment, the programming transistor 30 is positively biased only during the first operating cycle X11, and is not positively biased during the rest of the frame time. Since the programming transistor 30 is on for just small fraction of time, the shift of the threshold voltage $V_{T3}$ is negligible. Therefore, the current of the driving transistor 26 during the operating cycle X21 is independent of the shifts in its threshold voltage and OLED characteristics.

Figure 4:
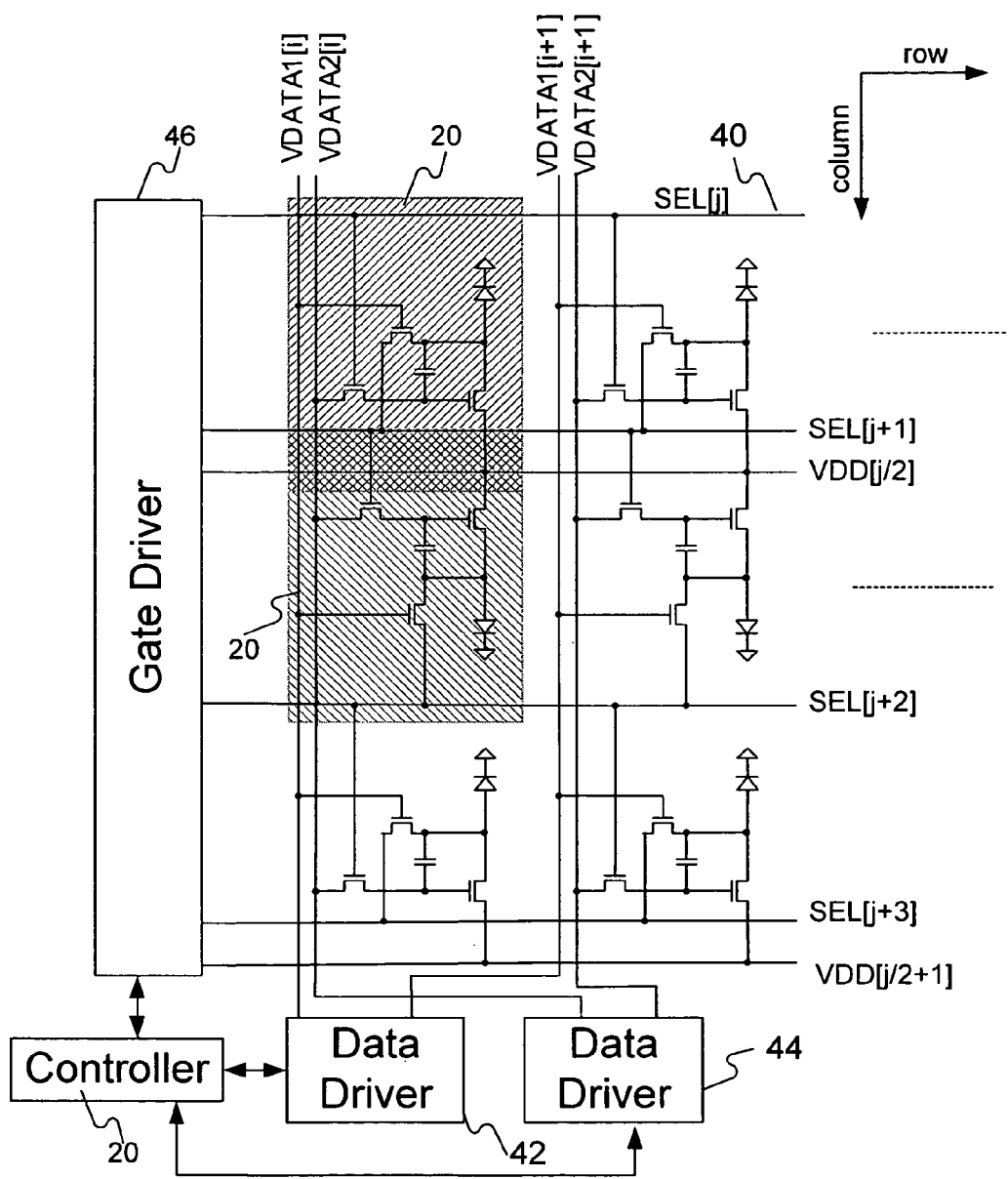
FIG. 4 is a diagram showing a display system having the pixel circuit of FIG. 2.

FIG. 4 illustrates a display system having the pixel circuit 20 of FIG. 2. VDD[j/2] and VDD[j/2+1] of FIG. 4 correspond to VDD of FIG. 2. VDATA1[j] and VDATA1[j+1] of FIG. 4 correspond to VDATA1 of FIG. 2. VDATA2[j] and VDATA2 [j+1] of FIG. 4 correspond to VDATA2 of FIG. 2. SEL[j], SEL[j+1], SEL[j+2], SEL[j+3] of FIG. 4 corresponds to SEL [n] or SEL[n+1] of FIG. 2.

In FIG. 4, six pixel circuits are shown as examples. The display system of FIG. 4 may include more than six pixel circuits In FIG. 4, two VDATA1 lines, two VDATA2 lines, two VDD lines and four SEL lines are shown as examples. The display system of FIG. 4 may include more than two VDATA1 lines, more than two VDATA2 lines, more than two VDD lines and more than four SEL lines.

The display array 40 of FIG. 4 is an AMOLED display having a plurality of the pixel circuits 20 of FIG. 2. In the array 40, the pixel circuits 20 are arranged in rows and columns. VDATA1 [i] and VDATA1[i+1] are shared between the common column pixels in the display array 40. VDATA2[i] and VDATA2[i+1] are shared between the common column pixels in the display array 40. SEL[j], SEL[j+1], SEL[j+2] and SEL[j+3] are shared between common row pixels in the display array 40. VDD[j/2] and VDD[j/2+1] are shared between common row pixels in the display array 40. In order to save the area and increase the aperture ratio, VDD [j/2] (VDD[j/2+1]) is shared between two consecutive rows.

A driver 42 is provided for driving VDATA1[j], VDATA1 [j+I] while a driver 44 is provided for driving VDATA2[j], VDATA2[j+1]. One of the drivers 42 and 44 contains the display data and the other does not. Depending on the line interface requirement, the drivers 42 and 44 may be located on the two sides of the display.

A driver 46 is provided for driving VDD[j/1], VDD[j/2+1] and SEL[j], SEL[j+1], SEL[j+2], SEL[j+3]. However, a driver for VDD[j/1], VDD[j/2+1] may be provided separately from a driver for SEL[j], SEL[j+1], SEL[j+2], SEL[j+3]. A controller 48 controls the drivers 42, 44 and 46 to drive the pixel circuits as described above.

Figure 5:
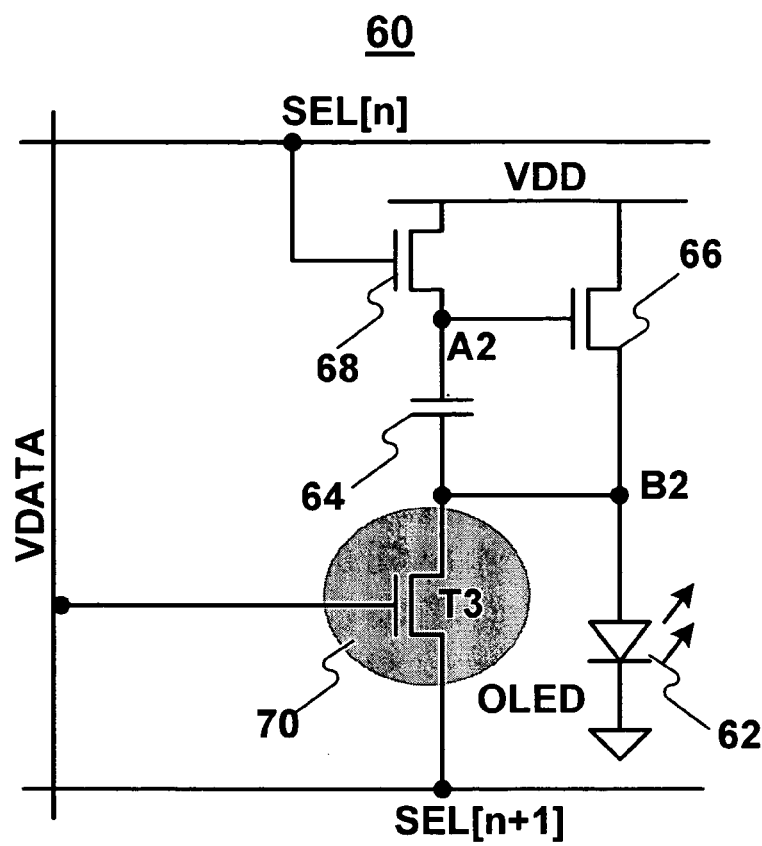
FIG. 5 is a diagram showing a pixel circuit in accordance with a further embodiment of the present invention.

FIG. 5 illustrates a locally referenced voltage programmed pixel circuit 60 in accordance with a further embodiment of the present invention. The pixel circuit 60 includes an OLED 62, a storage capacitor 64, a driving transistor 66, a switch transistor 68 and a programming circuit having a programming transistor 70. A select line SEL[n] is connected to the switch transistor 68. A signal line VDATA is connected to the programming transistor 70. A negative voltage line SEL[n+1] is connected to the programming transistor 70. A positive voltage line VDD is connected to the driving transistor 66 and the switch transistor 68. The voltage in VDD is controllable.

The transistors 66, 68 and 70 are n-type TFTs. However, the transistors 66, 68 and 70 may be p-type transistors. The driving technique applied to the pixel circuit 60 is also applicable to a complementary pixel circuit having p-type transistors. The transistors 66, 68 and 70 may be fabricated using amorphous silicon, nano/micro crystalline silicon, poly silicon, organic semiconductors technologies (e.g. organic TFT), NMOS/PMOS technology or CMOS technology (e.g. MOSFET). A plurality of pixel circuits 60 may form an AMOLED display.

The gate terminal of the driving transistor 66 is connected to VDD through the switch transistor 68. The drain terminal of the driving transistor 66 is connected to VDD. The source terminal of the driving transistor 66 is connected to the anode electrode of the OLED 62 (at node B2). The cathode electrode of the OLED 62 is connected to a common ground.

The gate terminal of the switch transistor 68 is connected to SEL[n]. The drain terminal of the switch transistor 68 is connected to VDD. The source terminal of the switch transistor 68 is connected to the gate terminal of the driving transistor 66 (at node A2).

The gate terminal of the programming transistor 70 is connected to VDATA. The drain terminal of the programming transistor 70 is connected to the anode terminal of the OLED 62 (at node B2). The source terminal of the programming transistor 70 is connected to SEL[n+1].

One terminal of the storage capacitor 64 is connected to the gate terminal of the driving transistor 66 and the source terminal of the switch transistor 68 at node A2. The other terminal of the storage capacitor 64 is connected to the source terminal of the driving transistor 66, the drain terminal of the programming transistor 70 and the anode electrode of the OLED 62 at node B2.

The programming transistor 70 is a stable local reference transistor due to its biasing condition and is used to adjust the pixel current during the programming cycle. Thus, the pixel current becomes stable despite the aging effects of the driving transistor 66 and the OLED 62.

Figure 6:
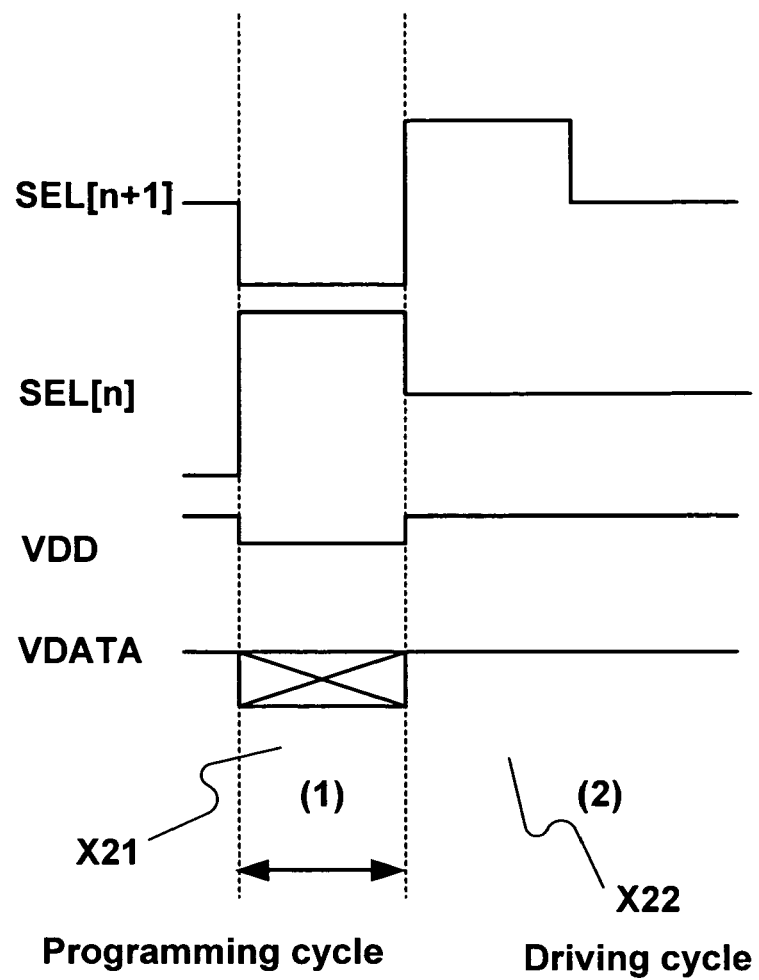
FIG. 6 is a timing diagram showing an example of waveforms for driving the pixel circuit of FIG. 5.

FIG. 6 illustrates a timing diagram showing an example of waveforms applied to the pixel circuit 60 of FIG. 5. Referring to FIGS. 5 and 6, the operation of the pixel circuit 60 includes a programming cycle X21 and a driving cycle X22.

As descried above, SEL[n+1] is shared between nth and (n+1)th rows, and plays two different roles during the programming cycle of nth and (n+1)th row. During the programming cycle of nth row, SEL[n+1] is used to provide the VSS signal. During the programming cycle of the (n+1)th row, SEL[n+1] is used to provide the address signal of (n+1)th row. Therefore, at the second programming cycle X22 of nth row which is the first programming cycle X21 of (n+1)th row as well, SEL[n+1] goes to a high voltage to address (n+1)th row.

The first operating cycle X21: SEL[n] is high and SEL[n+1] has a negative voltage VSS. VDATA goes to a programming voltage $V_P$+VSS, and VDD has a bias voltage $V_B$.

In X21, voltage at node A2 is $V_B$. Thus, voltage at node B2 can be written as $$VB2 = V_B - \left(\frac{(W/L)_{T3}}{(W/L)_{T1}}\right)^{1/2} V_P - \Delta V_T \quad (6)$$

$$-\Delta V_T = ((W/L)_{T3}/(W/L)_{T1})^{1/2} V_{T3} - V_{T1} \quad (7)$$

$$V_P = \text{VDATA1} - \text{VSEL}[n+1] \quad (8)$$

where VB2 represents the voltage of node B2, $V_{T1}$ represent the threshold voltage of the driving transistor 66, $V_{T3}$ represent the threshold voltage of the programming transistor 70, $(W/L)_{T1}$ is the aspect ratio of the driving transistor 66, and $(W/L)_{T3}$ is the aspect ration of the programming transistor 70.

The second operating cycle X21: SEL[n] is low, and SEL[n+1] is high because of the next row programming cycle. During the driving cycle X22, the voltage of SEL[n+1] is changed. That is due to the programming cycle of a next row as described below, and it does not affect the programming of current row.

In X22, voltage at node B2 goes to $V_{OLED}$, and the voltage at node A2 goes to:

$$VA2 = \left(\frac{(W/L)_{T3}}{(W/L)_{T1}}\right)^{1/2} V_P + \Delta V_T + V_{OLED} \quad (9)$$

The gate-source voltage VGS of the driving transistor 66 is given by:

$$VGS = ((W/L)_{T3}/(W/L)_{T1})^{1/2} V_P + V_{T1} - V_{T3} \quad (10)$$

In this embodiment, the programming transistor 70 is positively biased only during the first operating cycle X21, and is not positively biased during the rest of the frame time. Since the programming transistor 70 is on for just small fraction of time, the shift of the threshold voltage $V_{T3}$ is negligible. Therefore, the current of the driving transistor 66 during the operating cycle is independent of the shifts in its threshold voltage and OLED characteristics.

Figure 7:
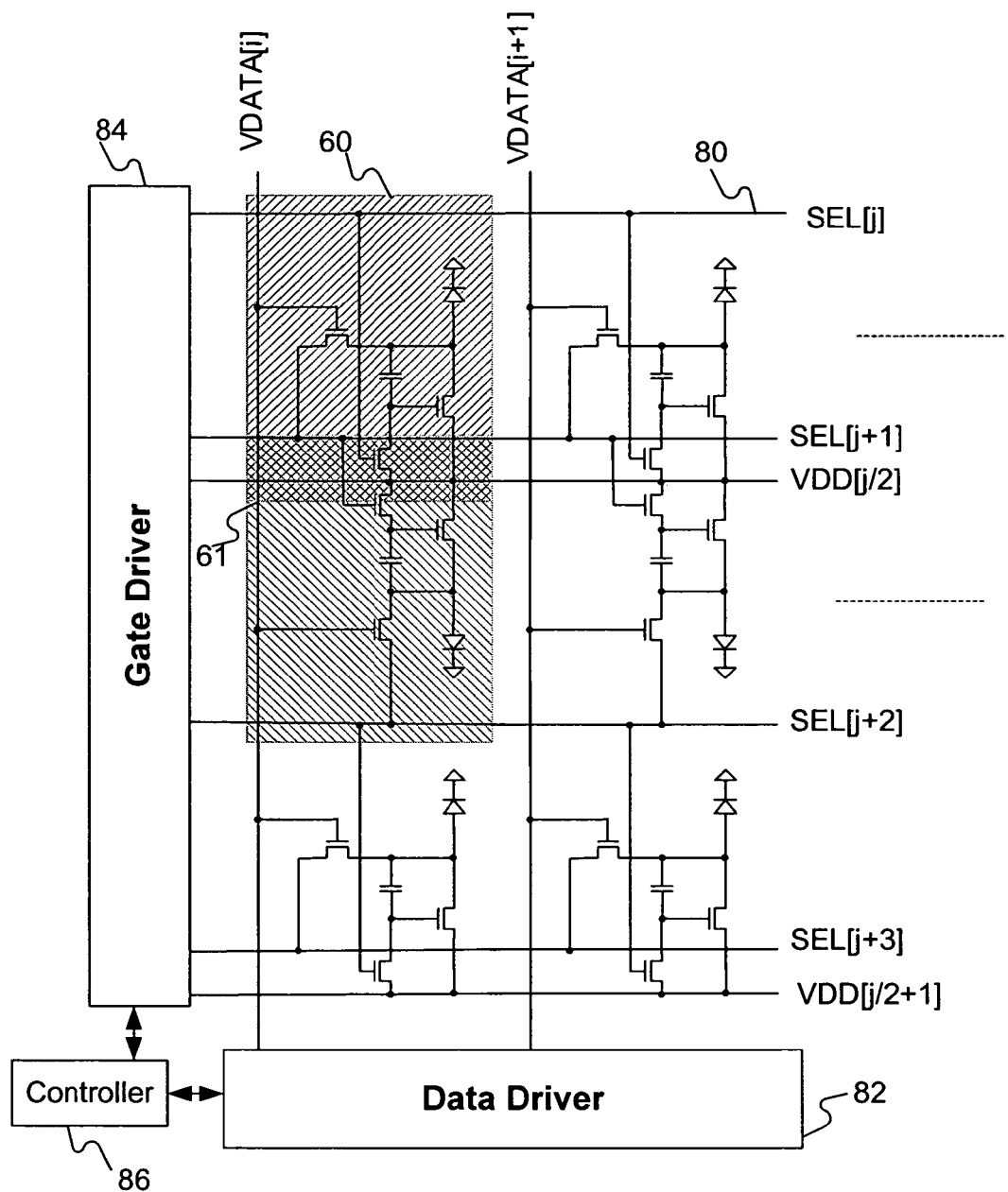
FIG. 7 is a diagram showing a display system having the pixel circuit of FIG. 5.

FIG. 7 illustrates a display system having the pixel circuit 60 of FIG. 5. VDD[j/2] and VDD[j/2+1] of FIG. 7 correspond to VDD of FIG. 5. VDATA1[i] and VDATA1[i+1] of FIG. 7 correspond to VDATA of FIG. 5. SEL[j], SEL[j+1], SEL[j+2], SEL[j+3] of FIG. 7 corresponds to SEL[n] or SEL[n+1] of FIG. 5.

In FIG. 7, six pixel circuits are shown as examples. The display system of FIG. 4 may include more than six pixel circuits In FIG. 7, two VDATA lines, two VDD lines and four SEL lines are shown as examples. The display system of FIG. 7 may include more than two VDATA lines, more than two VDD lines and more than four SEL lines.

The display array 80 of FIG. 7 is an AMOLED display having a plurality of the pixel circuits 60 of FIG. 5. The pixel circuits are arranged in rows and columns. VDATA [i] and VDATA [i+1] are shared between the common column pixels in the display array 80. SEL[j], SEL[j+1], SEL[j+2] and SEL[j+3] are shared between common row pixels in the display array 80. VDD[j/2] and VDD [j/2+1] are shared between common row pixels in the display array 80. In order to save the area and increase the aperture ratio, VDD [j/2] (VDD[j/2+1]) is shared between two consecutive rows.

A driver 82 is provided for driving VDATA [j], VDATA [j+1]. A driver 84 is provided for driving VDD[j/1], VDD[j/2+1] and SEL[j], SEL[j+1], SEL[j+2], SEL[j+3]. However, a driver for VDD[j/1], VDD[j/2+1] may be provided separately from a driver for SEL[j], SEL[j+1], SEL[j+2], SEL[j+3]. A controller 86 controls the drivers 82 and 84 to drive the pixel circuits as described above.

Figure 8:
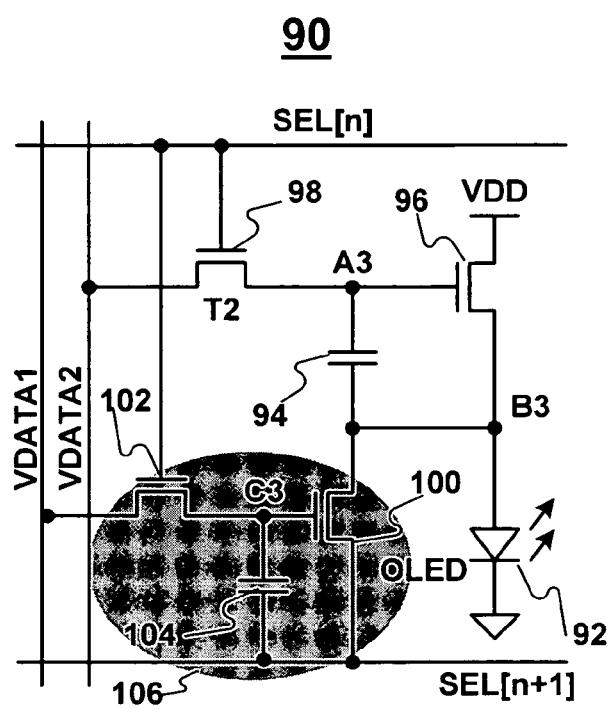
FIG. 8 is a diagram showing a pixel circuit in accordance with a further embodiment of the present invention.

FIG. 8 illustrates a locally referenced voltage programmed pixel circuit 90 in accordance with a further embodiment of the present invention. The pixel circuit 90 includes an OLED 92, a storage capacitor 94, a driving transistor 96, a switch transistor 98, and a programming circuit 106. The programming circuit 106 includes a programming transistor 100, a switch transistor 102 and a storage capacitor 104.

A select line SEL[n] is connected to the switch transistor 98. A signal line VDATA1 is connected to the switch transistor 102. A signal line VDATA2 is connected to the switch transistor 98. A negative voltage line SEL[n+1] is connected to the programming transistor 100. A positive voltage line VDD is connected to the driving transistor 96. The array structure of FIG. 4 can be used for the pixel circuit 90 of FIG. 8.

The transistors 96, 98, 100 and 102 are n-type TFTs. However, the transistors 96, 98, 100 and 102 may be p-type transistors. The driving technique applied to the pixel circuit 90 is also applicable to a complementary pixel circuit having p-type transistors. The transistors 96, 98, 100 and 102 may be fabricated using amorphous silicon, nano/micro crystalline silicon, poly silicon, organic semiconductors technologies (e.g. organic TFT), NMOS/PMOS technology or CMOS technology (e.g. MOSFET). A plurality of pixel circuits 90 may form an AMOLED display.

The gate terminal of the driving transistor 96 is connected to VDATA2 through the switch transistor 98. The drain terminal of the driving transistor 96 is connected to VDD. The source terminal of the driving transistor 96 is connected to the anode electrode of the OLED 92 (at node B3). The cathode electrode of the OLED 92 is connected to a common ground.

The gate terminal of the switch transistor 98 is connected to SEL[n]. The drain terminal of the switch transistor 98 is connected to VDATA2. The source terminal of the switch transistor 98 is connected to the gate terminal of the driving transistor 96 (at node A1).

The gate terminal of the programming transistor 100 is connected to VDATA1 through the switch transistor 102. The drain terminal of the programming transistor 100 is connected to the anode terminal of the OLED 92 (at node B3). The source terminal of the programming transistor 100 is connected to SEL[n+1].

The gate terminal of the switch transistor 102 is connected to SEL[n]. The source terminal of the switch transistor 102 is connected to VDATA1. The drain terminal of the switch transistor 102 is connected to the gate terminal of the programming transistor 100 (at node C3).

One terminal of the storage capacitor 94 is connected to the gate terminal of the driving transistor 96 and the source terminal of the switch transistor 98 at node A3. The other terminal of the storage capacitor 94 is connected to the source terminal of the driving transistor 96, the drain terminal of the switch transistor 90 and the anode electrode of the OLED 92 at node B3.

One terminal of the storage capacitor 104 is connected to the gate terminal of the programming transistor 100 and the drain terminal of the switch transistor 102 at node C3. The other terminal of the storage capacitor 104 is connected to SEL[n+1].

The programming circuit 106 is now described in detail. The operation of the pixel circuit 90 includes a programming cycle and a driving cycle. The programming transistor 100 is a stable local reference transistor due to its biasing condition, and is used to adjust the pixel current during the programming cycle. During the programming cycle, a programming voltage is written into the capacitor 104 through the switch transistor 102, and the programming transistor 100 adjusts the pixel current. During the driving cycle, a reset voltage is written into the capacitor 104 and so turns off the programming transistor 100. Therefore, the pixel current flows through the OLED 92. Since the programming transistor 100 is on only during the programming cycle, it does not experience any threshold shift. Thus, the pixel current which is defined by the programming transistor 100 becomes stable.

Figure 9:
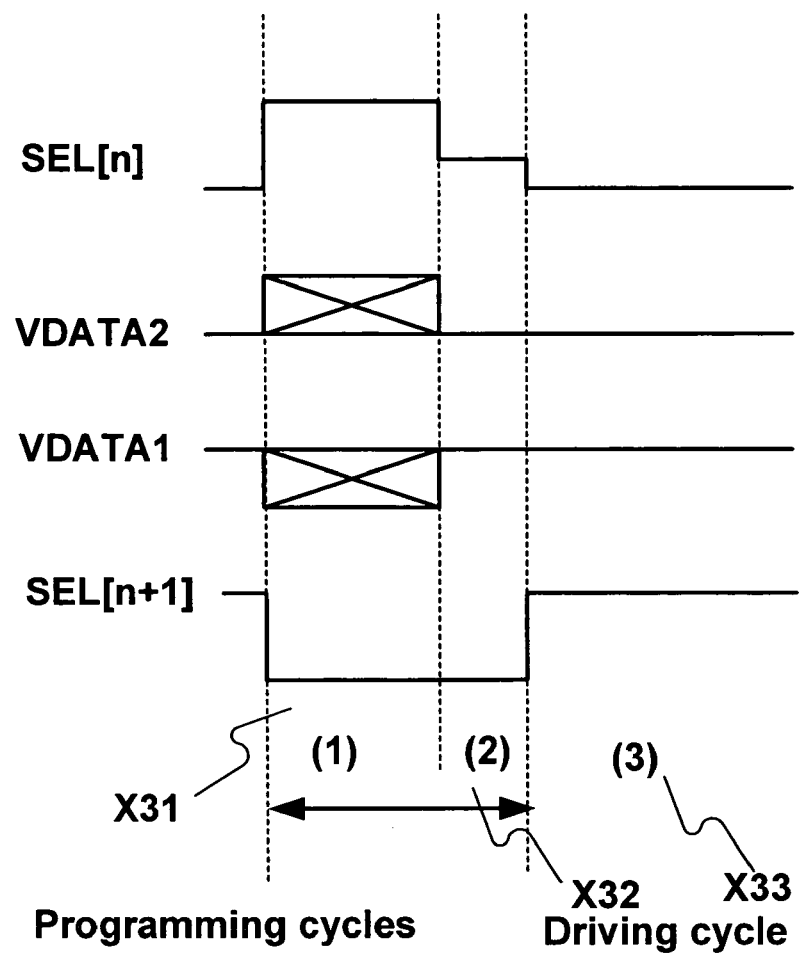
FIG. 9 is a timing diagram showing an example of waveforms for driving the pixel circuit of FIG. 8.

FIG. 9 illustrates a timing diagram showing an example of waveforms applied to the pixel circuit 90 of FIG. 8. Referring to FIGS. 8 and 9, the operation of the pixel circuit 90 includes a programming cycle having operation cycles X31 and X32 and a driving cycle having an operation cycle X33.

As described above, SEL[n+1] is shared between nth and (n+1)th rows, and plays two different roles during the programming cycle of nth and (n+1)th row. During the programming cycle of nth row, SEL[n+1] is used to provide a signal VSS. During the programming cycle of the (n+1)th row, SEL[n+1] is used to provide the address signal of (n+1)th row. Therefore, at the second programming cycle X32 of nth row which is the first programming cycle X31 of (n+1)th row as well, SEL[n+1] goes to a high voltage to address (n+1)th row.

The first operating cycle X31: SEL[n] is high and SEL[n+1] has a negative voltage VSS. VDATA1 goes to a programming voltage $V_P$+VSS, and VDATA2 has a bias voltage $V_B$.

Node C3 is charged to $V_P$+VSS. Node A3 is charged to the bias voltage $V_B$ As a result, voltage at node B3 goes to:

$$VB3 = V_B - \left(\frac{(W/L)_{T3}}{(W/L)_{T1}}\right)^{1/2} V_P - \Delta V_T \quad (11)$$

$$-\Delta V_T = ((W/L)_{T3}/(W/L)_{T1})^{1/2} V_{T3} - V_{T1} \quad (12)$$

where VB3 represents the voltage of node B3, $V_{T1}$ represent the threshold voltage of the driving transistor 96, and $V_{T3}$ represent the threshold voltage of the programming transistor 100, $(W/L)_{T1}$ is the aspect ratio of driving transistor 96, and $(W/L)_{T3}$ is the aspect ration of the programming transistor 100.

The gate-source voltage of the driving transistor 96 is given by:

$$VGS = ((W/L)_{T3}/(W/L)_{T1})^{1/2} VP + V_{T1} - V_{T3} \quad (13)$$

VGS remains at the same value during X32 and X33.

The second operating cycle X32: SEL[n] goes to an intermediate voltage in which the switch transistor 98 is off and the switch transistor 102 is on. VDATA1 goes to zero. Thus the programming transistor 100 turns off.

The third operating cycle X33: SEL[n] is low, and SEL[n+1] is high because of the next row programming cycle as described above.

In X33, node C3 is charged to a reset voltage. Voltage at node B3 goes to $V_{OLED}$ which is the corresponding OLED voltage for the give pixel current. Thus, voltage at node A3 goes to $$VA3 = \left(\frac{(W/L)_{T3}}{(W/L)_{T1}}\right)^{1/2} V_P + \Delta V_T + V_{OLED} \quad (14)$$

In this embodiment, the programming transistor 100 is positively biased only during the first operating cycle X31, and is not positively biased during the rest of the frame time. Since the programming transistor 100 is on for just a small fraction of time, its threshold shift is negligible. Therefore, the current of the driving transistor 96 during the operating cycle is independent of the shifts in its threshold voltage and OLED characteristics.

Figure 10:
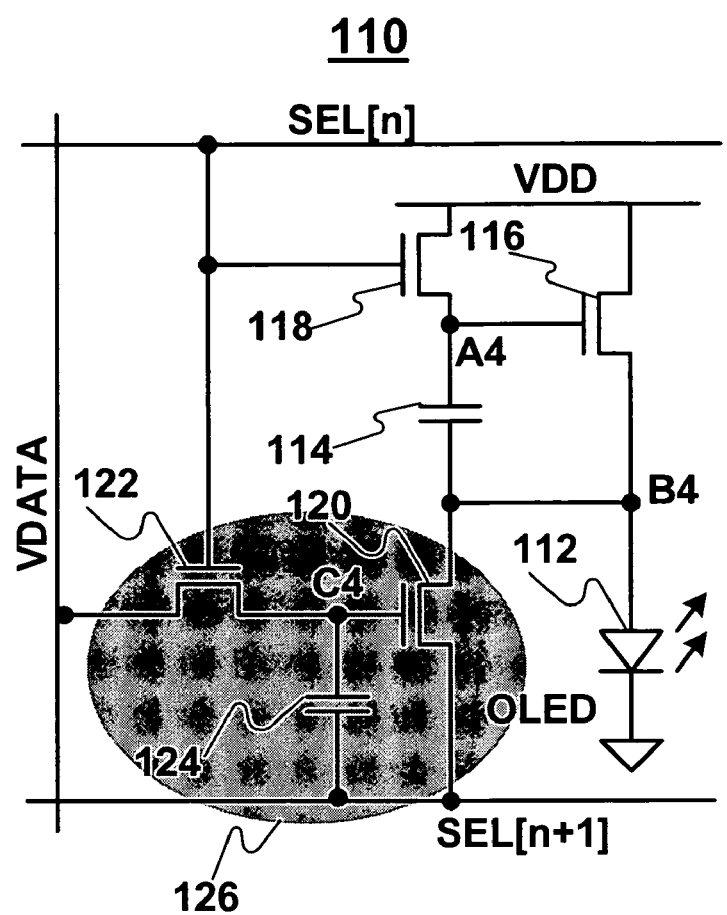
FIG. 10 is a diagram showing a pixel circuit in accordance with a further embodiment of the present invention.

FIG. 10 illustrates a locally referenced voltage programmed pixel circuit 110 in accordance with a further embodiment of the present invention. The pixel circuit 110 includes an OLED 112, a storage capacitor 114, a driving transistor 116, a switch transistor 118, and a programming circuit 126. The programming circuit 126 includes a switch transistor 120, a programming transistor 122 and a storage capacitor 124.

A select line SEL[n] is connected to the switch transistors 118 and 122. A signal line VDATA is connected to the switch transistor 122. A negative voltage line SEL[n+1] is connected to the programming transistor 120. A positive voltage line VDD is connected to the transistors 116 and 118. The voltage of VDD is changeable. The array structure of FIG. 7 can be used for the pixel circuit 110 of FIG. 10.

The transistors 116, 118, 120 and 122 are n-type TFTs. However, the transistors 116, 118, 120 and 122 may be p-type transistors. The programming and driving technique applied to the pixel circuit 110 is also applicable to a complementary pixel circuit having p-type transistors. The transistors 116, 118, 120 and 122 may be fabricated using amorphous silicon, nano/micro crystalline silicon, poly silicon, organic semiconductors technologies (e.g. organic TFT), NMOS/PMOS technology or CMOS technology (e.g. MOSFET). A plurality of pixel circuits 110 may form an AMOLED display.

The gate terminal of the driving transistor 116 is connected to VDD through the switch transistor 118. The drain terminal of the driving transistor 116 is connected to VDD. The source terminal of the driving transistor 116 is connected to the anode electrode of the OLED 112 (at node B4). The cathode electrode of the OLED 112 is connected to a common ground.

The gate terminal of the switch transistor 118 is connected to SEL[n]. The drain terminal of the switch transistor 118 is connected to VDD. The source terminal of the switch transistor 118 is connected to the gate terminal of the driving transistor 116 (at node A4).

The gate terminal of the programming transistor 120 is connected to VDATA through the switch transistor 122. The drain terminal of the programming transistor 120 is connected to the anode terminal of the OLED 112 (at node B4). The source terminal of the programming transistor 120 is connected to SEL[n+1].

The gate terminal of the switch transistor 122 is connected to SEL[n]. The source terminal of the switch transistor 122 is connected to VDATA. The drain terminal of the switch transistor 122 is connected to the gate terminal of the programming transistor 120 (at node C4).

One terminal of the storage capacitor 114 is connected to the gate terminal of the driving transistor 116 and the source terminal of the switch transistor 118 at node A4. The other terminal of the storage capacitor 114 is connected to the source terminal of the driving transistor 116, the drain terminal of the programming transistor 120 and the anode electrode of the OLED 112 at node B4.

One terminal of the storage capacitor 124 is connected to the gate terminal of the programming transistor 120 and the drain terminal of the switch transistor 122 at node C4. The other terminal of the storage capacitor 124 is connected to SEL[n+1].

The programming circuit 126 is described in detail. The operation of the pixel circuit 110 includes a programming cycle and a driving cycle. The programming transistor 120 is a stable local reference transistor due to its biasing condition, and is used to adjust the pixel current during the programming cycle. During the programming cycle, a programming voltage is written into the capacitor 124 through the switch transistor 122, and the programming transistor 120 adjusts the pixel current. During the driving cycle, a reset voltage is written into the capacitor 124 and so turns off the programming transistor 120. Therefore, the pixel current flows through the OLED 112. Since the programming transistor 120 is on only during the programming cycle, it does not experience any threshold shift. Thus, the pixel current which is defined by the programming transistor 120 becomes stable.

Figure 11:
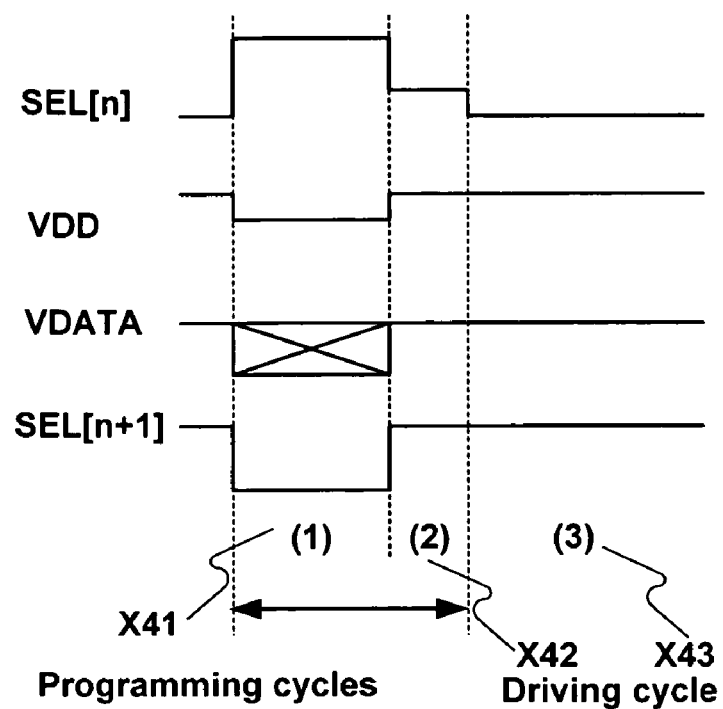
FIG. 11 is a timing diagram showing an example of waveforms for driving the pixel circuit of FIG. 10.

FIG. 11 illustrates a timing diagram showing an example of waveforms applied to the pixel circuit 110 of FIG. 10. Referring to FIGS. 10 and 11, the operation of the pixel circuit 110 includes a programming cycle having operation cycles X41 and X42 and a driving cycle having an operation cycle X43.

As described above, SEL[n+1] is shared between nth and (n+1)th rows, and plays two different roles during the programming cycle of nth and (n+1)th row. During the programming cycle of nth row, SEL[n+1] is used to provide a signal VSS. During the programming cycle of the (n+1)th row, SEL[n+1] is used to provide the address signal of (n+1)th row. Therefore, at the second programming cycle X42 of nth row which is the first programming cycle X41 of (n+1)th row as well, SEL[n+1] goes to a high voltage to address (n+1)th row.

The first operating cycle X41: SEL[n] is high and SEL[n+1] has a negative voltage VSS. VDATA goes to a programming voltage $V_P$+VSS, and VDD has a bias voltage $V_B$.

Node C4 is charged to $V_P$+VSS. Node A4 is charged to the bias voltage $V_B$. As a result, voltage at node B4 goes to:

$$VB4 = V_B - \left(\frac{(W/L)_{T3}}{(W/L)_{T1}}\right)^{1/2} V_P - \Delta V_T \tag{15}$$

$$-\Delta V_T = ((W/L)_{T3}/(W/L)_{T1})^{1/2} V_{T3} - V_{T1} \tag{16}$$

where VB4 represents the voltage of node B4, $V_{T1}$ represent the threshold voltage of the driving transistor 116, and $V_{T3}$ represent the threshold voltage of the programming transistor 120, $(W/L)_{T1}$ is the aspect ratio of the driving transistor 116, and $(W/L)_{T3}$ is the aspect ration of the programming transistor 120.

The gate-source voltage VGS of the driving transistor 116 is given by:

$$VGS = ((W/L)_{T3}/(W/L)_{T1})^{1/2} V_P + V_{T1} - V_{T3} \tag{17}$$

VGS remains at the same value during X42 and X43.

The second operating cycle X42: SEL[n] goes to an intermediate voltage in which the switch transistor 118 is off, and the switch transistor 122 is on. VDATA goes to zero. Thus, the programming transistor 120 turns off.

The third operating cycle X43: SEL[n] is low, and SEL[n+1] is high because of the next row programming cycle as described above.

In X43, node C4 is charged to a reset voltage. Voltage at node B4 goes to $V_{OLED}$ which is the corresponding OLED voltage for voltage for the give pixel current. As a result, voltage at node A4 goes to:

$$VA4 = \left(\frac{(W/L)_{T3}}{(W/L)_{T1}}\right)^{1/2} V_P + \Delta V_T + V_{OLED} \tag{18}$$

In this embodiment, the programming transistor 120 is positively biased only during the first operating cycle X41. During the rest of the frame time, the programming transistor 120 is not positively biased. Since the programming transistor 120 is on for just a small fraction of time, its threshold shift is negligible. Therefore, the current of the driving transistor 116 during the operating cycle is independent of the shifts in its threshold voltage and OLED characteristics.

Figure 12:
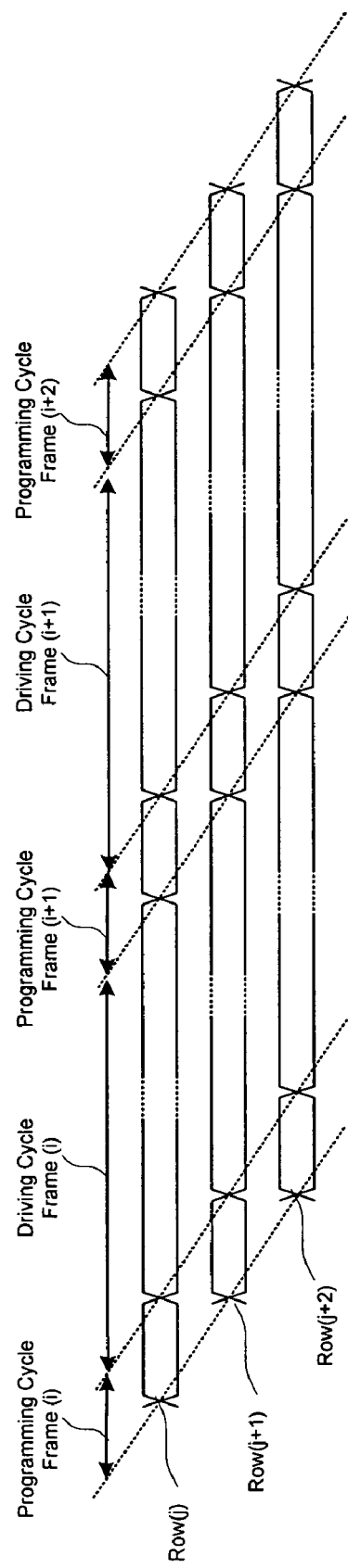
FIG. 12 is a timing diagram showing an example of programming and driving cycles applied to the array of FIGS. 4 and 7.
Figure 13:
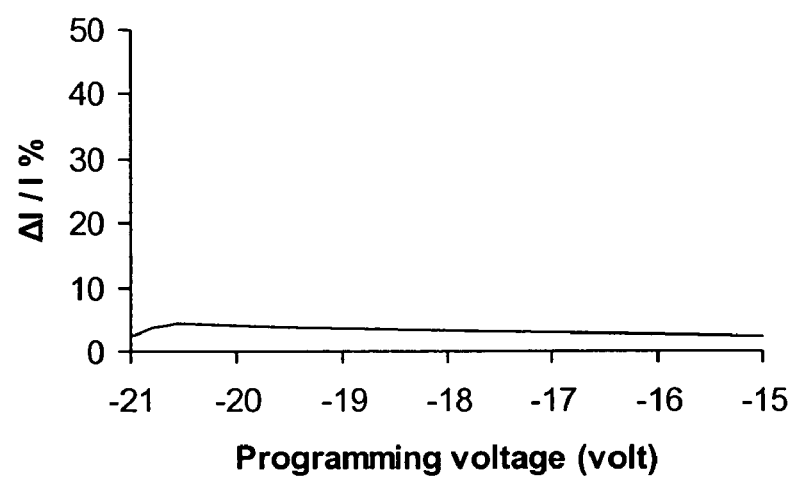
FIG. 13 is a diagram showing simulation result for the driving technique applied to FIGS. 2 and 3.

FIG. 12 is a diagram showing programming and driving cycles for driving the display arrays of FIGS. 4 and 7. In FIG. 13, each of ROW(j), ROW(j+1), and ROW(j+2) represents a row of the display array. The programming and driving cycles for the frame at a ROW overlap with the programming and driving cycles for the same frame at a next ROW. Each programming and driving cycles are those of FIG. 3, 6, 8 or 10.

FIG. 13 illustrates the simulation result for the circuit and waveform shown in the FIGS. 2 and 3. The result shows that the change in the OLED current due 2-volt threshold-shift in the driving transistor 26 is less than 4%.

According to the embodiments of the present invention, the shift(s) of the characteristic(s) of a pixel element(s) (e.g. the threshold voltage shift of a driving transistor and the degradation of a light emitting device under prolonged display operation) is compensated for by voltage stored in a storage capacitor and applying it to the gate of the driving transistor. Thus, the pixel circuit provides a stable current independent of the threshold voltage shift of the driving transistor and OLED degradation under prolonged display operation, which efficiently improves the display operating lifetime. According to the embodiments of the present invention, the brightness stability of the OLED is enhanced by using circuit compensation.

Because of the circuit simplicity, it ensures higher product yield, lower fabrication cost and higher resolution than conventional pixel circuits. Further the driving technique can be employed in large area display due to its fast settling time.

Further, the programming circuit (transitory) is isolated from the line parasitic capacitance unlike the conventional current programming circuit, it ensures fast programming.

All citations are hereby incorporated by reference.

The present invention has been described with regard to one or more embodiments. However, it will be apparent to persons skilled in the art that a number of variations and modifications can be made without departing from the scope of the invention as defined in the claims. Therefore, the invention as defined in the claims, must be accorded the broadest possible interpretation so as to encompass all such modifications and equivalent structures and functions.

What is claimed is:

1. A pixel circuit comprising:
a light emitting device having a first electrode and a second electrode;
a driving transistor having a gate terminal, a first terminal and a second terminal, the first terminal of the driving transistor being connected to the first electrode of the light emitting device;
a first capacitor having first and second terminals, the first terminal of the first capacitor being connected to the gate terminal of the driving transistor, the second terminal of the first capacitor being connected to the first terminal of the driving transistor and the first electrode of the light emitting device;
a first switch transistor having a gate terminal, a first terminal and a second terminal, the first terminal of the first switch transistor being connected the gate terminal of the driving transistor and the first terminal of the first capacitor; and
a programming circuit having a programming transistor, the programming transistor having a gate terminal, a first terminal and a second terminal,
the first terminal being connected to the first electrode of the light emitting device,
the gate of said programming transistor being directly connected to a first data line, wherein,
during a programming cycle of the pixel circuit, the programming transistor converts a voltage from the first data line to a current to adjust the voltage at said first electrode of said light emitting device, and
during a driving cycle of the pixel circuit, the programming transistor is turned off and the light emitting device is driven with the pixel current from said driving transistor.

2. A pixel circuit according to claim 1, wherein the programming circuit includes a second switch transistor and a second capacitor, the second switch transistor having a gate terminal, a first terminal and a second terminal, the second capacitor having a first terminal and a second terminal, the gate terminal of the programming transistor being connected to the first terminal of the second switch transistor and the first terminal of the second capacitor.

3. A pixel circuit according to claim 2, wherein voltage provided to the pixel circuit is determined so that during the programming cycle, a programming voltage is written into the second capacitor through the second switch transistor while during the driving cycle of the pixel circuit, a reset voltage is written into the second capacitor to turn off the programming transistor.

4. A pixel circuit according to claim 1, wherein the light emitting device includes an organic light emitting diode (OLED), and at least one of the transistors is a n-type or p-type thin-film transistor (TFT).

5. A display system, comprising:
a display array including a plurality of pixel circuits according to claim 1;
a driver system for driving the display array to establish a programming cycle and a driving cycle; and
a controller for controlling the driver system.

6. A display system according to claim 5, wherein the driver system drives a first select line connected to the gate terminal of the first switch transistor, a second select line connected to the second terminal of the programming transistor, a first signal line connected to the gate terminal of the programming transistor; and a second signal line connected to the second terminal of the switch transistor.

7. A display system according to claim 6, wherein the plurality of pixel circuits are arranged in rows and columns, each of the first and second select lines being shared between common row pixel circuits in the display array, and each of the first and second signal lines being shared between common column pixel circuits in the display array.

8. A display system according to claim 7, wherein during the programming cycle of nth row, the second select line is used to provide a predetermined voltage, and during the programming cycle of the (n+1)th row, the second select line is used to provide the address signal of (n+1)th row.

9. A display system according to claim 5, wherein the driver system drives a first select line connected to the gate terminal of the first switch transistor, a second select line connected to the second terminal of the programming transistor, a signal line connected to the gate terminal of the programming transistor; and a voltage line connected to the second terminal of the first switch transistor and the second terminal of the driving transistor.

10. A display system according to claim 9, wherein the plurality of pixel circuits are arranged in rows and columns, each of the first select line, the second select line, and the voltage line being shared between common row pixel circuits in the display array, and the signal line being shared between common column pixel circuits in the display array.

11. A display system according to claim 10, wherein during the programming cycle of nth row, the second select line is used to provide a predetermined voltage, and during the programming cycle of the (n+1)th row, the second select line is used to provide the address signal of (n+1)th row.

12. A display system according to claim 5, wherein the programming circuit includes a second switch transistor and a second capacitor, the second switch transistor having a gate terminal, a first terminal and a second terminal, the second capacitor having a first terminal and a second terminal, the gate terminal of the programming transistor being connected to the first terminal of the second switch transistor and the first terminal of the second capacitor.

13. A display system according to claim 12, wherein the driver system drives a first select line connected to the gate terminal of the first switch transistor, a second select line connected to the second terminal of the programming transistor, a first signal line connected to the second terminal of the second switch transistor; and a second signal line connected to the second terminal of the first switch transistor.

14. A display system according to claim 13, wherein the plurality of pixel circuits are arranged in rows and columns, each of the first and second select lines being shared between common row pixel circuits in the display array, and each of the first and second signal lines being shared between common column pixel circuits in the display array.

15. A display system according to claim 14, wherein during the programming cycle of nth row, the second select line is used to provide a predetermined voltage, and during the programming cycle of the (n+1)th row, the second select line is used to provide the address signal of (n+1)th row.

16. A display system according to claim 12, wherein the driver system drives a first select line connected to the gate terminal of the first switch transistor, a second select line connected to the second terminal of the programming transistor, a signal line connected to the second terminal of the second switch transistor; and a voltage line connected to the second terminal of the first switch transistor and the second terminal of the driving transistor.

17. A display system according to claim 16, wherein the plurality of pixel circuits are arranged in rows and columns, each of the first select line, the second select line, and the voltage line being shared between common row pixel circuits in the display array, and the signal line being shared between common column pixel circuits in the display array.

18. A display system according to claim 17, wherein during the programming cycle of nth row, the second select line is used to provide a predetermined voltage, and during the programming cycle of the (n+1)th row, the second select line is used to provide the address signal of (n+1)th row.

19. A pixel circuit structure according to claim 1, wherein at least one of the switch, programming and driving transistors is a n-type or p-type thin film transistors (TFTs).

20. A pixel circuit structure according to claim 1, wherein the light emitting device is an inverted (NIP) or non-inverted (PIN) organic light emitting device (OLED).

21. A pixel circuit according to claim 1, wherein the programming transistor is a thin film transistor (TFT), and the pixel circuit incorporates a short term biasing condition in which a programming TFT is stable.

22. A pixel circuit according to claim 1, wherein the light emitting device is an (OLED), and wherein the programming transistor is under stress for a small fraction of frame time and adjusting the pixel current, while the driving transistor drives the OLED.

23. A method of driving a pixel circuit, the pixel circuit comprising a light emitting device having a first electrode and a second electrode; a driving transistor having a gate terminal, a first terminal and a second terminal, the first terminal of the driving transistor being connected to the first electrode of the light emitting device; a first capacitor having first and second terminals, the first terminal of the first capacitor being connected to the gate terminal of the driving transistor, the second terminal of the first capacitor being connected to the first terminal of the driving transistor and the first electrode of the light emitting device; a first switch transistor having a gate terminal, a first terminal and a second terminal, the first terminal of the first switch transistor being connected the gate terminal of the driving transistor and the first terminal of the first capacitor; and a programming circuit having a programming transistor, the programming transistor having a gate terminal, a first terminal and a second terminal, the first terminal being directly connected to the first electrode of the light emitting device; and the gate of said programming transistor being directly connected to a first data line, the method comprising:

at a programming cycle of the pixel circuit, converting a voltage supplied to the gate of the programming transistor from the first data line to a current to adjust the voltage at said first electrode of said light emitting device;

at a driving cycle of the pixel circuit, turning off the programming transistor and driving the light emitting device with pixel current from the driving transistor.

24. A method of driving a pixel circuit according to claim 23, wherein at least one of the switch, programming and driving transistors is a n-type or p-type thin film transistors (TFTs).

25. A method of driving a pixel circuit according to claim 23, wherein the light emitting device in the pixel circuit is an inverted (NIP) or non-inverted (PIN) organic light emitting device (OLED).

26. The method of driving a pixel circuit according to claim 23, wherein the pixel circuit further comprises a first select line connected to the gate terminal of the first switch transistor, a second select line connected to the second terminal of the programming transistor, a first signal line connected to the gate terminal of the programming transistor; and a second signal line connected to the second terminal of the switch transistor.

27. The method of driving a pixel circuit according to claim 23, wherein the pixel circuit further comprises a first select line connected to the gate terminal of the first switch transistor, a second select line connected to the second terminal of the programming transistor, a signal line connected to the gate terminal of the programming transistor; and a voltage line connected to the second terminal of the first switch transistor and the second terminal of the driving transistor.

28. The method of driving a pixel circuit according to claim 23, wherein the programming circuit further comprises a second switch transistor and a second capacitor, the second switch transistor having a gate terminal, a first terminal and a second terminal, the second capacitor having a first terminal and a second terminal, the gate terminal of the programming transistor being connected to the first terminal of the second switch transistor and the first terminal of the second capacitor.

29. The method of driving a pixel circuit according to claim 28, wherein the pixel circuit further comprises a first select line connected to the gate terminal of the first switch transistor, a second select line connected to the second terminal of the programming transistor, a first signal line connected to the gate terminal of the programming transistor; and a second signal line connected to the second terminal of the switch transistor.

30. The method of driving a pixel circuit according to claim 28, wherein the pixel circuit further comprises a first select line connected to the gate terminal of the first switch transistor, a second select line connected to the second terminal of the programming transistor, a signal line connected to the gate terminal of the programming transistor; and a voltage line connected to the second terminal of the first switch transistor and the second terminal of the driving transistor.

* * * * *